United States Patent [19]
Abe

[11] Patent Number: 5,293,348
[45] Date of Patent: Mar. 8, 1994

[54] RANDOM ACCESS MEMORY DEVICE WITH COLUMNS OF REDUNDANT MEMORY CELLS DISTRIBUTED TO MEMORY CELL ARRAYS AND SHARED THEREBETWEEN

[75] Inventor: Kazuhiko Abe, Tokyo, Japan

[73] Assignee: NEC Corporation, Tokyo, Japan

[21] Appl. No.: 942,852

[22] Filed: Sep. 10, 1992

[30] Foreign Application Priority Data

Sep. 10, 1991 [JP] Japan ............................ 3-258404

[51] Int. Cl.⁵ .............................................. G11C 7/00
[52] U.S. Cl. ................................. 365/230.03; 365/200; 371/10.3
[58] Field of Search ................... 365/200, 230.03; 371/10.2, 10.3

[56] References Cited

U.S. PATENT DOCUMENTS

| | | | |
|---|---|---|---|
| 4,908,798 | 3/1990 | Urai | 365/230.03 |
| 4,918,662 | 4/1990 | Kondo | 365/200 |
| 4,935,899 | 6/1990 | Morigami | 365/200 |

Primary Examiner—Eugene R. LaRoche
Assistant Examiner—Andrew Tran
Attorney, Agent, or Firm—Sughrue, Mion, Zinn, Macpeak & Seas

[57] ABSTRACT

A random access memory device has at least one column of redundant memory cells for replacing a column of defective regular memory cells therewith, and a block address decoder circuit selects one of regular memory cell blocks on the basis of block address bits in so far as excellent regular memory cell is accessed; however, if one of the defective regular memory cells is accessed, the block decoder circuit selects a regular memory cell block associated with the at least one column of redundant memory cells regardless of the block address bits so that any separate row address decoder circuit and any separate sense amplifier/ write driver circuit are not required for the at least one column of redundant memory cells, thereby decreasing the peripheral circuits.

4 Claims, 7 Drawing Sheets

RANDOM ACCESS MEMORY DEVICE WITH COLUMNS OF REDUNDANT MEMORY CELLS DISTRIBUTED TO MEMORY CELL ARRAYS AND SHARED THEREBETWEEN

FIELD OF THE INVENTION

This invention relates to a random access memory device and, more particularly, to a redundant memory cells incorporated therein.

DESCRIPTION OF THE RELATED ART

Modern semiconductor technologies have miniaturized the circuit components of a random access memory device, and, accordingly, the memory cell array has been increased in integration density. Crystal defects of the semiconductor wafer are much liable to attack the miniaturized memory cells, and redundant technologies have been developed for rescuing defective products.

Figure 1:
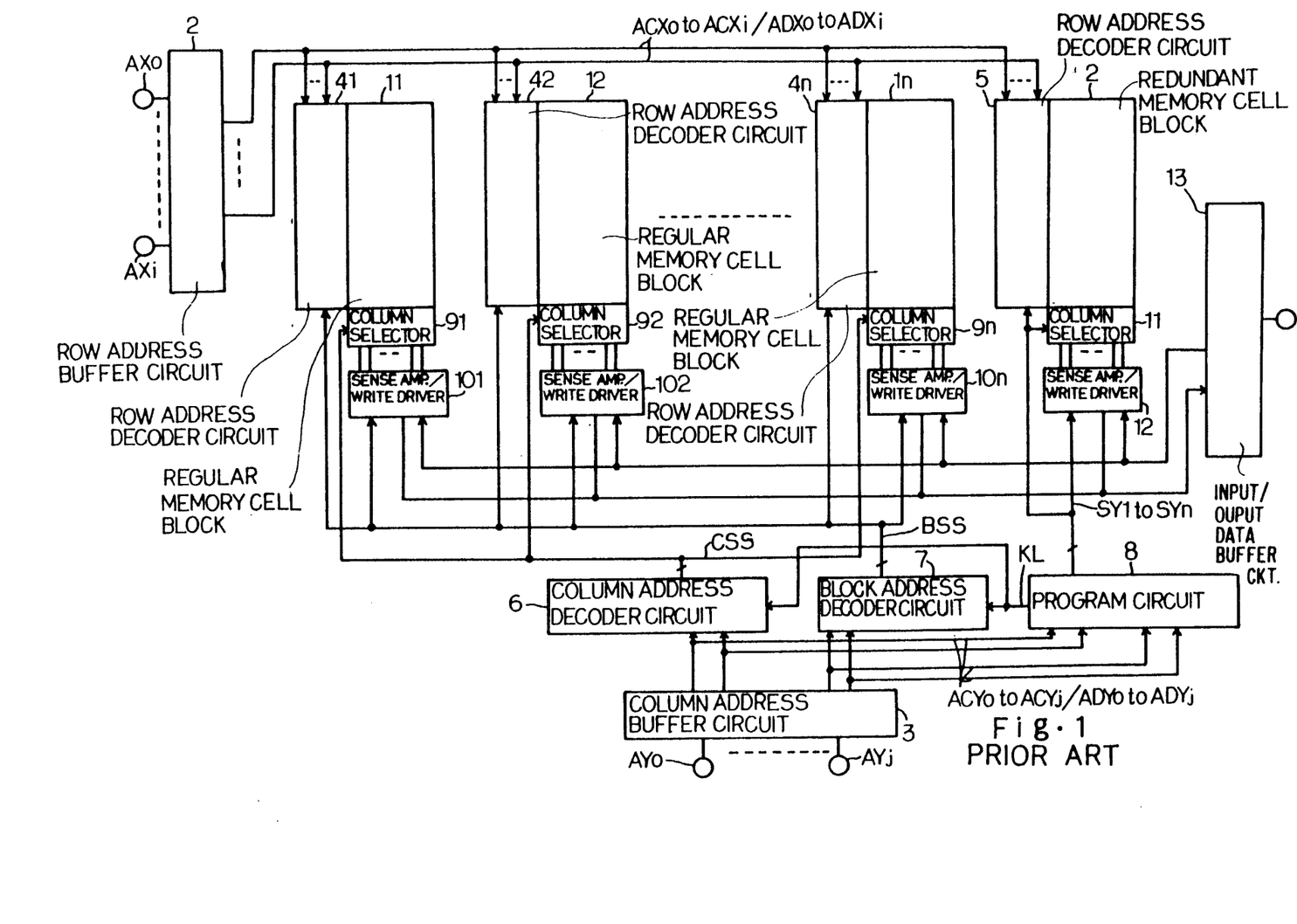
FIG. 1 is a block diagram showing the arrangement of the first prior art random access memory device.

FIG. 1 shows a typical example of the random access memory device with redundant memory cells, and largely comprises a data storage facility and a peripheral unit. The data storage facility has a plurality of regular memory cell blocks 11, 12, . . . and 1n respectively assigned block addresses, and a redundant memory cell block 2, and each of the regular memory cell blocks 11 to 1n is fabricated from a plurality of regular memory cells arranged in rows and columns. The redundant memory cell block 2 is also fabricated from a plurality of redundant memory cells arranged in rows and columns, and any column of defective regular memory cells is replaceable with one of the columns of the redundant memory cells. In other words, the redundant memory cell block 2 is shared between all of the regular memory cell blocks 11 to 1n. A row address and a column address are indicative of a memory location of each memory cell block 11 to 1n or 2 occupied by a regular memory cell or a redundant memory cell.

The peripheral unit is broken down into an addressing sub-unit and a data transmission sub-unit. Namely, external row address bits AX0 to AXi and external column address bits AY0 to AYj are respectively stored in a row address buffer circuit 2 and a column address buffer circuit 3, and the row and column address buffer circuits 2 and 3 produce address predecoded signal ACX0 to ACXi/ ADX0 to ADXi and ACY0 to ACYi/ ADY0 to ADYj. The row address predecoded signals ADX0 to ADXi are complementary signals of the row address predecoded signals ACX0 to ACXi, respectively, and the column address predecoded signals ADY0 to ADYj are the complementary signals to the column address predecoded signals ACY0 to ACYj. The regular memory cell blocks 11 to 1n are respectively associated with regular row address decoder circuits 41, 42, . . . and 4n, and the redundant memory cell block 2 is also associated with a redundant row address decoder circuit 5. The address predecoded signals ACX0 to ACXi/ ADX0 to ADXi are indicative of a row address, and are supplied to not only the regular row address decoder circuits 41 to 4n but also the redundant row address buffer circuit 5. Each of the regular row address decoder circuits selects a row of the regular memory cells assigned the row address from the associated regular memory cell block 11, 12, . . . or 1n, and the redundant row address decoder circuit 5 also selects a row of the redundant memory cells assigned the row address from the redundant memory cell block 2.

The column address buffer circuit 3 is associated with a column address decoder circuit 6, a block address decoder circuit 7 and a program circuit 8. Each of the memory cell blocks 11 to 1n is assigned a block address, and the columns of the regular memory cells of each regular memory cell block 11, 12, . . . or 1n are respectively assigned column addresses. The external column address bits consist of higher order bits indicative of a block address and lower order bits indicative of a column address, and the address predecoded signals ACY0 to ACYj and ADY0 to ADYj are supplied partially to the column address decoder circuit 6, and the column address decoder circuit 6 produces column selecting signals CSS for selecting columns of the regular memory cells from the respective regular memory cell blocks 11 to 1n. The remaining part of the address predecoded signals ACY0 to ACYj and ADY0 to ADYj are supplied to the block address decoder circuit 7, and the block address decoder circuit 7 produces block selecting signals BSS for selecting one of the memory cell blocks 11 to 1n. All of the address predecoded signals ACY0 to ACYj and ADY0 to ADYj are supplied to the program circuit 8. The program circuit stores a plurality sets of column and block addresses assigned to columns of defective regular memory cells replaced with the columns of the redundant memory cells.

Figure 2:
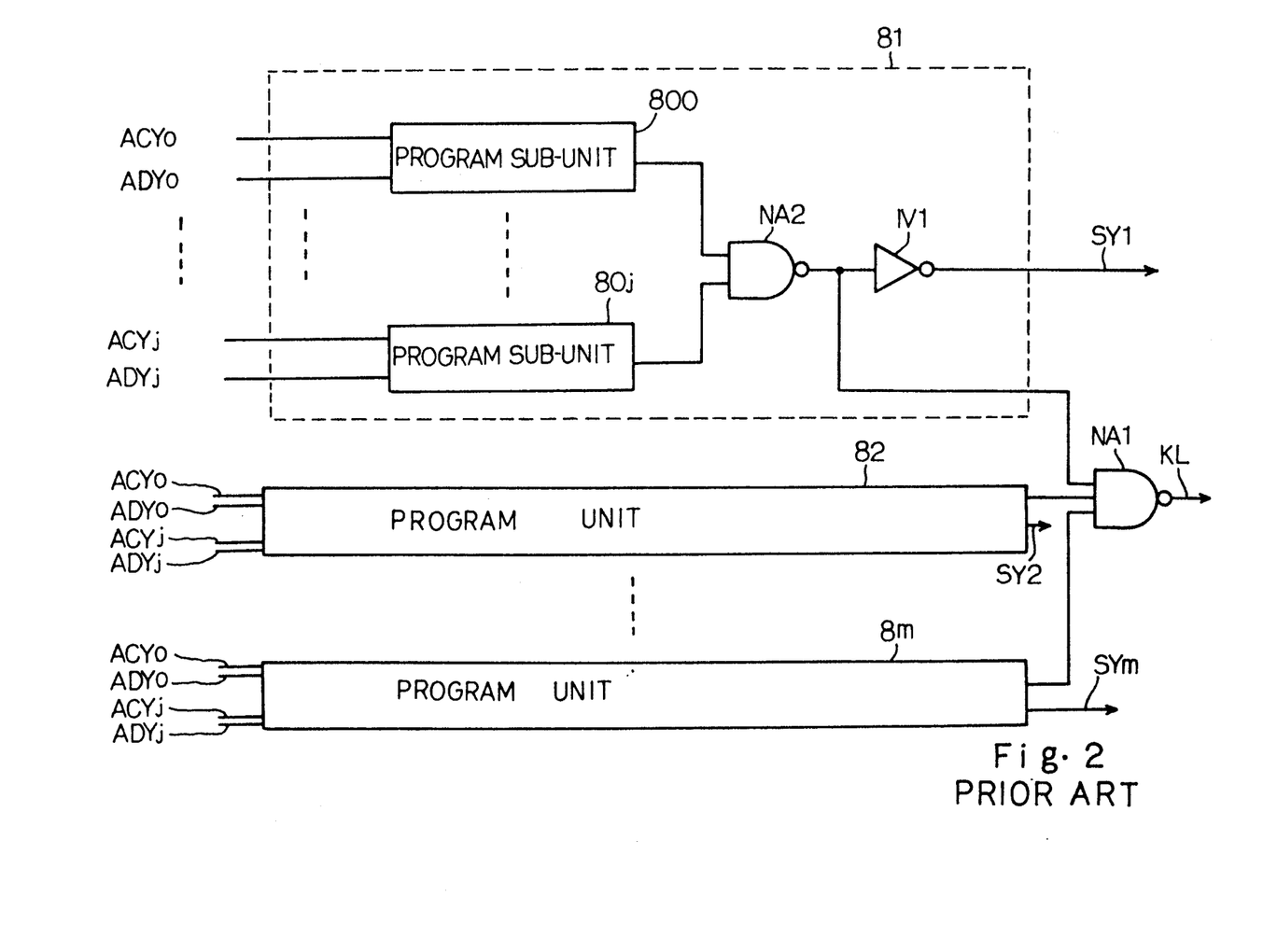
FIG. 2 is a circuit diagram showing the arrangement of the program circuit incorporated in the first prior art random access memory device.

The circuit arrangement of the program circuit 8 is illustrated in FIG. 2, and largely comprises a plurality of program units 81, 82, . . . and 8m, and a NAND gate NA1. The plurality of program units 81 to 8m respectively stores the plurality sets of block and column addresses, and are respectively associated with the columns of the redundant memory cells. All of the program units 81 to 8m are similar in circuit arrangement to one another, and each of the program units 81 to 8m has a plurality of program sub-units 800 to 80j, a NAND gate NA2 and an inverter IV1. The address predecoded signals ACY0/ ADY0 to ACYj/ ADYj are coupled with the program sub-units 800 to 80j, and each set of the address predecoded signals ACY0/ ADY0 or ACYj/ ADYj are compared with one of the bits of the block and column addresses assigned to one of the columns replaced with one of the columns of the redundant memory cells. If the address predecoded signals ACY0/ ADY0 to ACYj/ ADYj are indicative of the block and column addresses replaced with one of the columns of the redundant memory cells, all of the program sub-units 800 to 80j of the associated program unit supply output signals of logic "1" level to the NAND gate NA2, and the NAND gates NA2 shifts the output signal thereof to logic "0" level. With the output signal of logic "0" level, the inverter IV1 shifts one of the redundant column selecting signals SY1 to SYn to high voltage level corresponding to logic "1" level, and the NAND gate NA1 shifts a disable signal KL to the high voltage level corresponding to logic "1" level.

Figure 3:
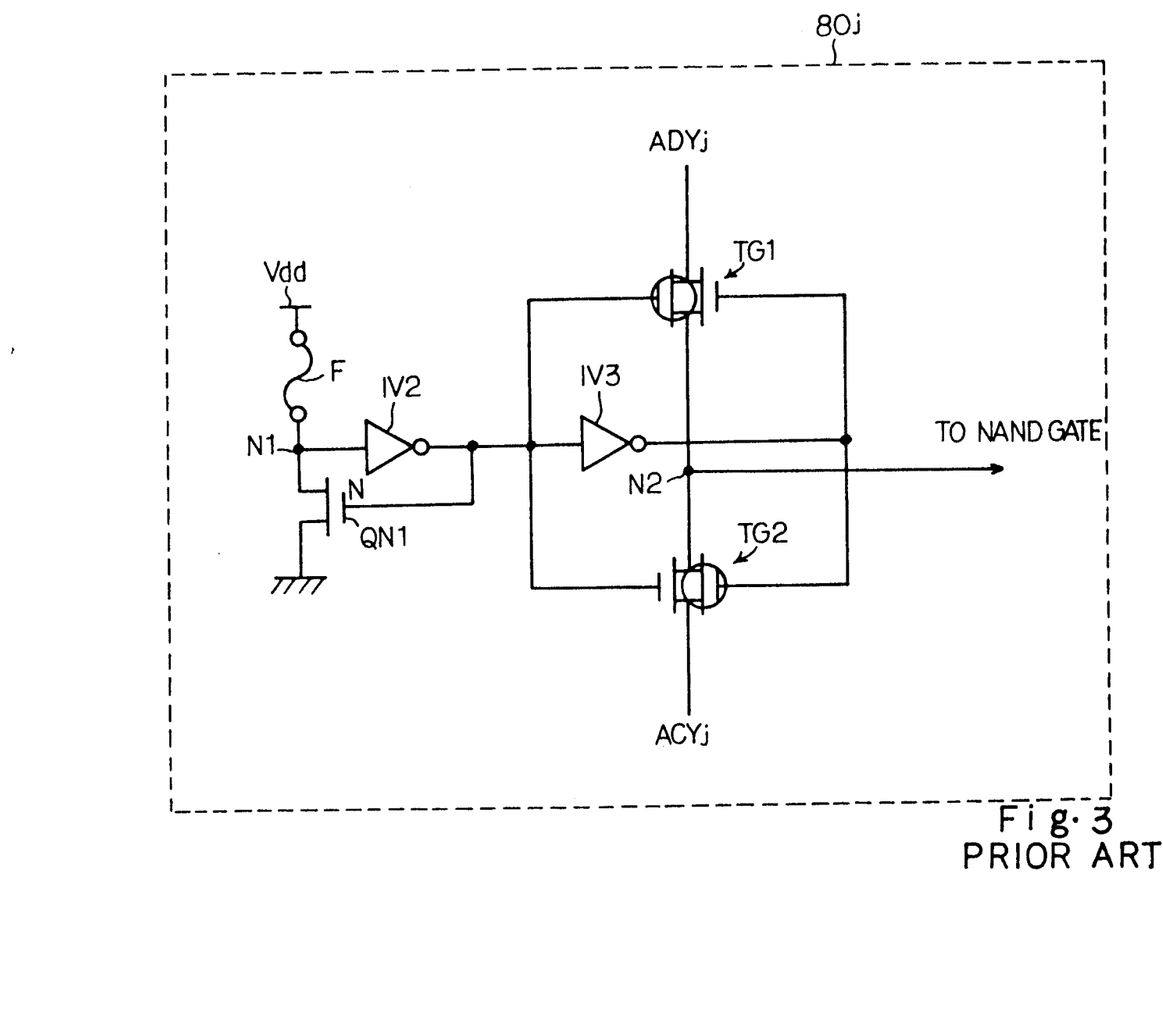
FIG. 3 is a circuit diagram showing the arrangement of the program unit incorporated in the program circuit.

FIG. 3 illustrates the circuit arrangement of the program sub-unit 80j, and the program sub-unit 80j comprises a series combination of a fuse element F and an n-channel enhancement type switching transistor QN1 coupled between a source of power voltage level Vdd and the ground voltage line, an inverter IV2 responsive to the voltage level at the drain node N1 for controlling the n-channel enhancement type switching transistor QN1, an inverter IV3 coupled at the input node thereof with the output node of the inverter IV2, and transfer gates TG1 and TG2 for selectively transferring either address predecoded signal ACj or ADj to the output node N2. If a bit of the block and column addresses is logic "1" level for storing the data bit of logic "1" level, the fuse element F is broken, and the drain node N1 is isolated from the source of power voltage level Vdd. Then, the inverter produces a logic "0" signal which is supplied to the n-channel enhancement type switching transistor QN1 so as to fix the drain node N1 to the ground voltage level corresponding to logic "1" level. The logic "0" signal is further supplied to the inverter IV3 for producing a logic "1" signal, and the logic "0" signal and the logic "1" signal are supplied to the transfer gates TG1 and TG2. In this situation, the transfer gate TG2 turns on, and the other transfer gate TG3 remains off. Therefore, if the corresponding external column address bit is logic "1" level, the corresponding column address bit is consistent with the bit stored in the program sub-unit 80j, and the address predecoded signal ACYj is transferred through the transfer gate TG2 to the output node N2 as the output signal thereof. However, if the corresponding external column address bit is logic "0" level, the transfer gate TG2 transfers the address predecoded signal ADYj of logic "0" level, and the output signal of the program sub-unit 80j is in logic "0" level. On the other hand, if the program sub-unit 80j stores a bit of logic "0" level, the fuse element F still conducts the drain node N1 with the source of power voltage level Vdd, and the inverter IV2 produces a logic "0" signal. The logic "0" signal allows the n-channel enhancement type switching transistor QN1 to remain off, and the inverter IV3 produces a logic "1" signal. In this situation, the transfer gate TG1 turns on, and the other transfer gate TG2 is turned off. Therefore, the address predecoded signal ADYj is transferred to the output node N2, and the output signal of the program sub-unit 80j is consistent with the address predecoded signal ADYj. If the corresponding column address bit is logic "0" level, the corresponding column address bit is consistent with the bit stored in the program sub-unit 80j, and the output signal of the program sub-unit 80j is shifted to logic "1" level. However, if the corresponding column address bit is logic "1" level, the corresponding column address bit is inconsistent with the bit stored in the program sub-unit 80j, and the address predecoded signal ADYj is transferred to the output node N2 as the output signal thereof. Thus, the output signal of logic "1" level is indicative of the consistence between the bit stored in the program sub-unit and the corresponding column address bit. Therefore, if all the bits stored in the program sub-units 800 to 80j are consistent with all of the column address bits indicative of the block and column addresses assigned to the column of defective regular memory cells, the output signals of logic "1" level are supplied from the program sub-units 800 to 80j to the NAND gate NA1. However, in case of inconsistency, at least one of the output signals is logic "0" level, and the NAND gate NA1 shifts the output signal thereof to logic "1" level.

The data transmission sub-unit comprises regular column selector circuits 91, 92, . . . and 9n respectively associated with the regular memory cell blocks 11 to 1n, regular sense amplifier/ write-in driver circuits 101, 102, . . . and 10n respectively coupled with the regular column selector circuits 91 to 9n, a redundant column selector circuit 11 coupled with the redundant memory cell block 2, a redundant sense amplifier/ write driver circuit 12 coupled with the redundant column selector circuit 11, and an input/ output data buffer circuit 13 shared between the regular sense amplifier/ write driver circuits 101 to 10n and the redundant sense amplifier/ write driver circuit 12. The regular row address decoder circuits 41 to 4n and the regular sense amplifier/ write driver circuits 101 to 10n are selectively enabled with the block selecting signals BSS, and the regular column selector circuits 91 to 9n are responsive to the column selecting signals CCS for selecting the columns assigned the column address from the respective regular memory cell blocks 11 to 1n.

If any column of the regular memory cells is not replaced with the columns of the redundant memory cells, the column address decoder circuit 6 and the block address decoder circuit 7 are enabled at all times, and the block address decoder circuit 7 enables one of the regular row address decoder circuits 41 to 4n and one of the regular sense amplifier/ write driver circuits 101 to 10n. In the read-out phase of operation, the enabled regular row address decoder circuit is responsive to the address predecoded signals ACX0 to ACXi/ ADX0 to ADXi, and data bits are read out from the regular memory cells of the associated memory cell block to digit line pairs coupled therewith. The associated column selector circuit is responsive to the column selecting signals CSS, and transfers one of the data bits on the digit line pairs to the associated regular sense amplifier/ write driver circuit. The differential voltage indicative of the selected data bit is developed by the sense amplifier, and the developed differential voltage is relayed to the input/ output data buffer circuit 13. The read-out data bit is delivered from the input/ output data buffer circuit 13. On the other hand, if the random access memory device entered in the write-in phase of operation, a write-in data bit is relayed vice versa, and written into one of the regular memory cells of the selected regular memory cell block coupled with the selected word line.

On the other hand, if columns of defective regular memory cells are respectively replaced with the columns of the redundant memory cells, the program circuit 8 stores sets of block and column addresses assigned to the columns of the defective regular memory cells by selectively breaking the fuse elements F. If the random access memory device is established in the read-out phase, the address predecoded signals ACY0 to ACYj/ ADY0 to ADYj supply the block and column addresses indicated by the external column address bits to the program circuit 8, and the program circuit 8 compares the block and column addresses with the sets of block and column addresses stored therein. If the block and column addresses are not consistent with any set of block and column addresses, the block and column address decoder circuits 7 and 6 behave as those described hereinbefore. However, if the block and column addresses are matched with one of the sets of block and column addresses, the program circuit 8 disables the column and block address decoder circuits 6 and 7 with the disable signal KL, and enables the redundant row address decoder circuit 5 and the redundant column selector circuit 11. Then, the address predecoded signals ACX0 to ACXi/ ADX0 to ADXi are decoded by the redundant row address decoder 5, and data bits are read out from the redundant memory cells to the redundant column selector circuit 11. The program circuit 8 causes the redundant column selector circuit 11 to transfer one of the data bits to the redundant sense amplifier/ write driver circuit 12, and the developed differential voltage indicative of the read-out data bit is transferred from the redundant sense amplifier/ write driver circuit 12 to the input/ output data buffer circuit 13. If the random access memory device is established in the write-in phase, a write-in data bit is propagated vice versa, and stored in one of the redundant memory cells.

Thus, the prior art random access memory device thus arranged replaces a column of defective regular memory cells of any regular memory cell block with one of the columns of the redundant memory cell block 2, and the columns of the redundant memory cells are available for all of the regular memory cell blocks 11 to 1n. However, the redundant column selector circuit 11 and the redundant sense amplifier/ write driver circuit 12 are indispensable for the redundant memory cell block 2, and the real estate occupied thereby is not ignorable.

Figure 4:
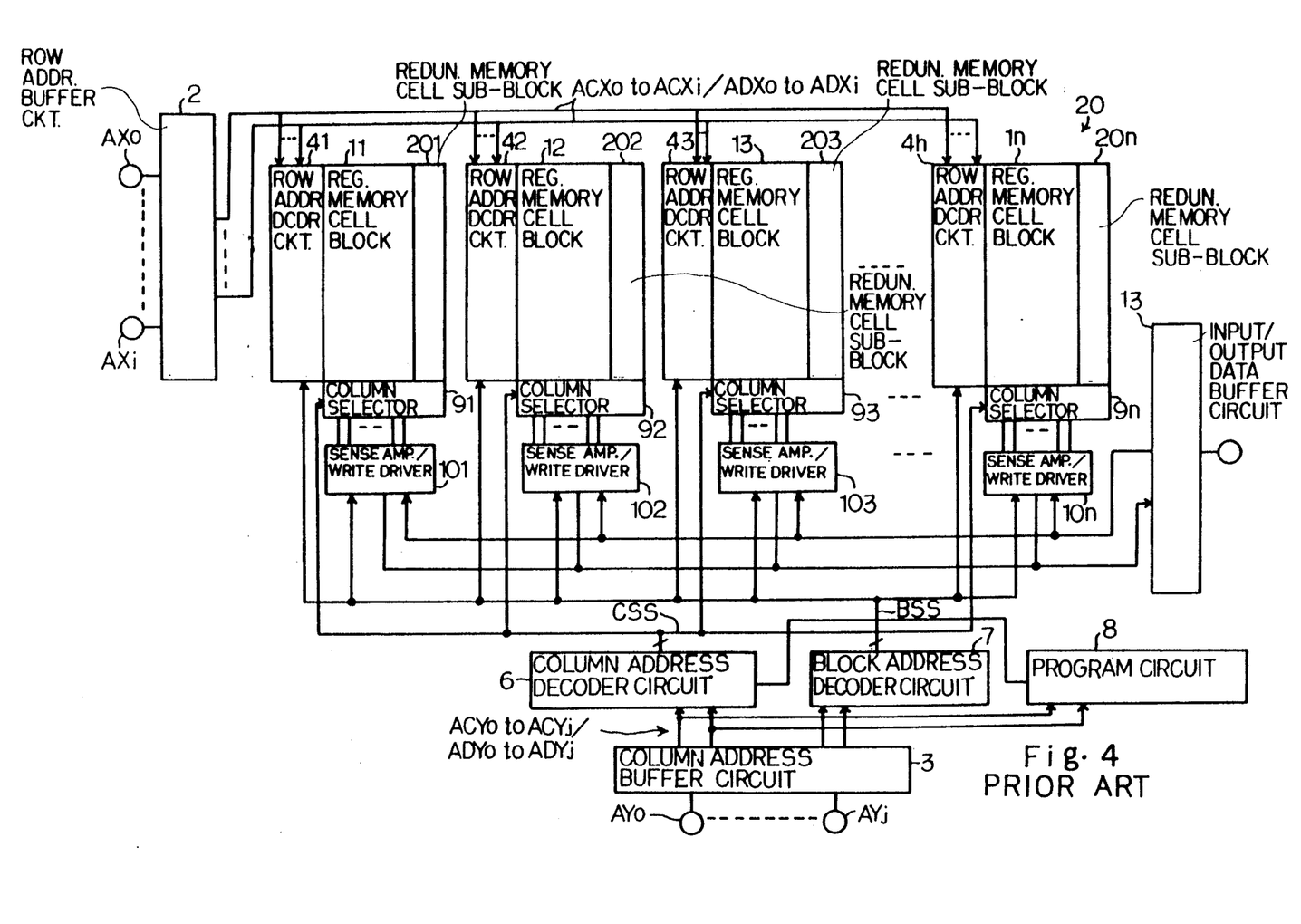
FIG. 4 is a block diagram showing the arrangement of the second prior art random access memory device.

FIG. 4 illustrates another prior art random access memory device, and the prior art random access memory device shown in FIG. 4 is similar to the first random access memory device except for a redundant memory cell block 20. The component circuits of the second prior art random access memory device are labeled with the same references designating the corresponding component circuits of the first prior art random access memory device without any detailed description. The redundant memory cell block 20 is broken down into redundant memory cell sub-blocks 201 to 20n, and the redundant memory cell sub-blocks 201 to 20n are respectively incorporated in the regular memory cell blocks 11 to 1n. The second prior art random access memory device thus arranged does not require any redundant row address decoder circuit and any sense amplifier/ write driver circuit, and the redundant column selector circuit is broken into a plurality sets of transfer transistors which are selectively incorporated in the regular column selector circuits. For this reason, any real estate is not assigned to a redundant row address decoder circuit as well as to a sense amplifier/ write driver circuit, and the memory cell array can be increased in integration density.

However, if defective regular memory cells are concentrated to one of the regular memory cell blocks 11 to 1n, the redundant memory sub-block assigned thereto can rescue the random access memory device in so far as the columns of the defective regular memory cells are smaller in number than the columns of the redundant memory sub-block. However, if the columns of the defective regular memory cells are larger in number than the columns of the redundant memory cell sub-block, the random access memory device is rejected as an inferior product even though another redundant memory cell sub-block is not used. For this reason, the redundant memory cell block 20 can not rescue the random access memory device where defective regular memory cells are concentrated in one of the regular memory cell blocks, and the production yield is not enhanced as the first prior art random access memory device Thus, there is a trade-off between the integration density of the regular memory cell array and the production yield.

SUMMARY OF THE INVENTION

It is therefore an important object of the present invention to provide a random access memory device which is improved in integration density of the regular memory cell array without sacrifice of production yield.

To accomplish the object, the present invention proposes to couple a column of redundant memory cells with an associated sense amplifier/ write driver circuit even if the column of the redundant memory cells and a column of defective regular memory cells are associated with different regular memory cell blocks.

In accordance with the present invention, there is provided a random access memory device comprising: a) a plurality of regular memory cell blocks respectively assigned block addresses, and each having columns of regular memory cells respectively assigned column addresses; b) at least one column of redundant memory cells associated with one of the plurality of regular memory cell blocks, the redundant memory cells respectively storing data bits, one of the columns of regular memory cells of any one of the plurality of regular memory cell blocks being replaced with the at least one column of redundant memory cells when the aforesaid one of the columns contains at least one defective regular memory cell; c) a plurality of row address decoder circuits respectively associated with the aforesaid one of the plurality of regular memory cell blocks and with the others of the plurality of regular memory cell blocks, and selectively enabled with block selecting signals indicative of one of the block addresses; d) a plurality of column selector circuits respectively associated with the plurality of regular memory cell blocks, and each responsive to column selecting signals indicative of one of the column addresses for selecting a column of regular memory cells from the associated regular memory cell block; e) at least one transfer means coupled with the at least one column of redundant memory cells, and responsive to a redundant column selecting signal for transferring one of the data bits stored in the redundant memory cells; f) a plurality of amplifier means respectively coupled with the plurality of column selector circuits for a read-out mode and a write-in mode of operation, one of the plurality of amplifier means being further coupled with the transfer means, the plurality of amplifier means being selectively enabled with the block selecting signals; g) a program circuit storing a set of block and column addresses assigned to aforesaid the one of the columns of regular memory cells containing the at least one defective regular memory cell, and comparing block and column addresses indicated by external address bits to see whether or not the block and column addresses are consistent with the set of block and column addresses, the program circuit producing a disable signal and the redundant column selecting signal when the block and column addresses are consistent with the set of block and column addresses; h) a column address decoder circuit selectively shifting the column selecting signals to an active level on the basis of parts of the external address bits indicative of the aforesaid one of the column addresses in the absence of the disable signal; and i) a block address decoder circuit selectively shifting the block selecting signals to an active level on the basis of others of the external address bits indicative of the aforesaid one of the block addresses in the absence of the visable signal, the block address decoder circuit being responsive to the redundant column selecting signal in the presence of the disable signal for shifting one of the block selecting signals indicative of the aforesaid one of the plurality of regular memory cell blocks associated with the at least one column of redundant memory cells to the active level.

BRIEF DESCRIPTION OF THE DRAWINGS

The features and advantages of the random access memory device according to the present invention will be more clearly understood from the following description taken in conjunction with the accompanying drawings in which.

DESCRIPTION OF THE PREFERRED EMBODIMENTS

First Embodiment

Figure 5:
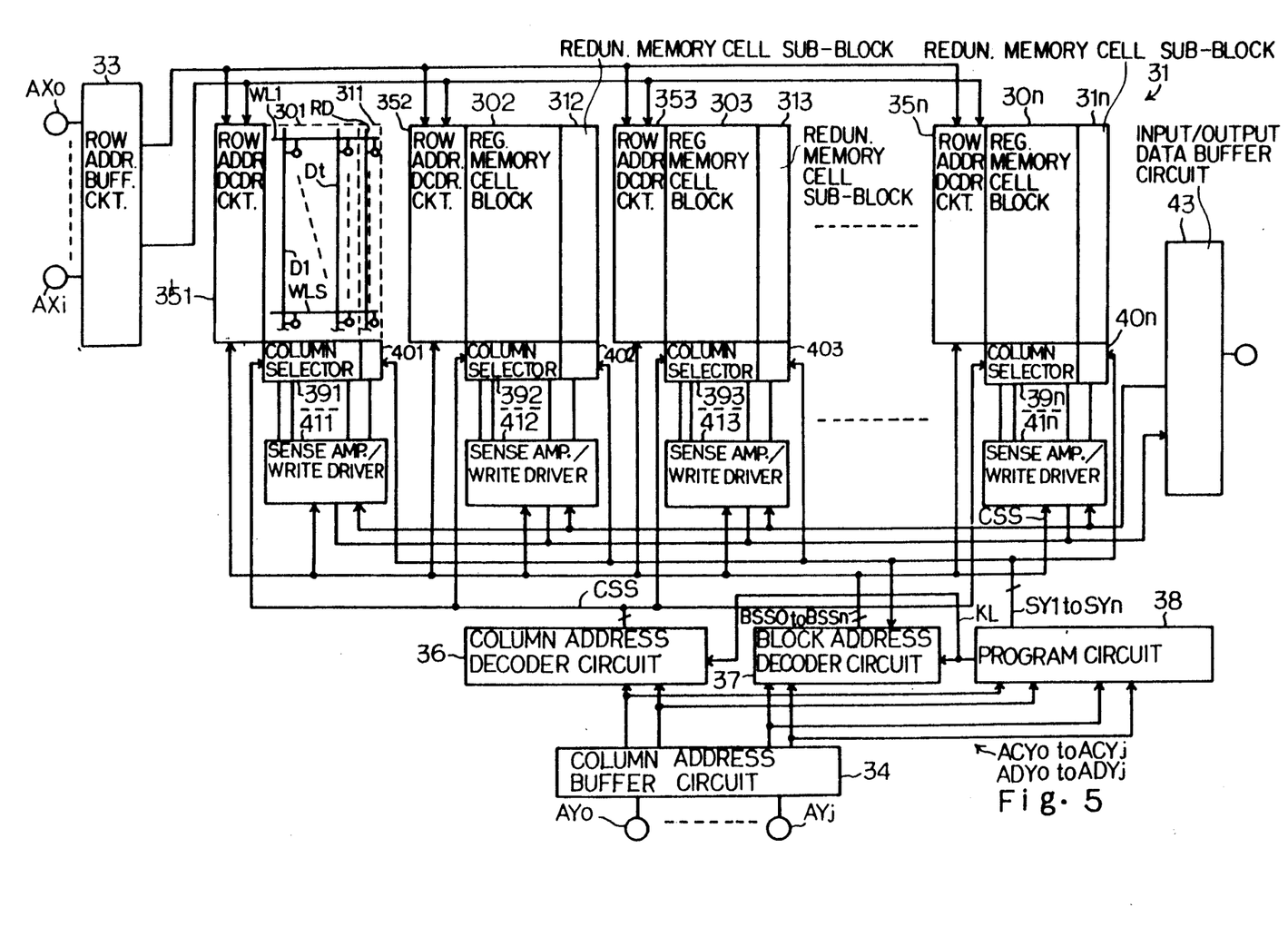
FIG. 5 is a block diagram showing the arrangement of a random access memory device according to the present invention.

Referring to FIG. 5 of the drawings, a random access memory device embodying the present invention largely comprises a data storage facility and a peripheral unit. The data storage facility has a plurality of regular memory cell blocks 301, 302, 303 . . . and 30n respectively assigned block addresses, and each of the regular memory cell blocks 301 to 30n is fabricated from a plurality of regular memory cells arranged in rows and columns. Bubbles in FIG. 5 stand for the regular memory cells. A redundant memory cell block 31 is provided in association with the regular memory cell blocks 301 to 30n. is broken down into a plurality of redundant memory cell sub-blocks 311, 312, 313 and 31n respectively associated with the regular memory cell blocks 301 to 30n. The redundant memory cell block 31 is fabricated from columns of redundant memory cells, and each of the columns of the redundant memory cells forms one of the redundant memory cell sub-blocks 311 to 31n in this instance. Any column of defective regular memory cells is replaceable with one of the columns of the redundant memory cells. In other words, the redundant memory cell block 31 is shared between all of the regular memory cell blocks 301 to 30n. A plurality sets of word lines are respectively associated with the regular memory cell blocks 301 to 30n, and the word lines WL1 to WLs of each set are coupled with the respective rows of the regular memory cells of the associated regular memory cell block as well as the respective redundant memory cells. A plurality sets of digit line pairs are further associated with the regular memory cell blocks 301 to 30n, and the digit line pairs D1 to Dt of each set are coupled with the columns of the regular memory cells of the associated regular memory cell block. However, the columns of the redundant memory cells are coupled with redundant digit line pairs RD, respectively. Row addresses are assigned to the corresponding word lines of all the regular memory cell blocks 301 to 30n, and column addresses are also assigned to the corresponding columns of all the regular memory cell blocks 301 to 30n, respectively. Therefore, a row address and a column address select a regular memory cell from every regular memory cell block 301, 302, 303, . . . or 30n.

The peripheral unit is broken down into an addressing sub-unit and a data transmission sub-unit. In detail, external row address bits AX0 to AXi and external column address bits AY0 to AYj are respectively stored in a row address buffer circuit 33 and a column address buffer circuit 34, and the row and column address buffer circuits 33 and 34 produce row address predecoded signal ACX0 to ACXi/ ADX0 to ADXi and column address predecoded signals ACY0 to ACYi/ ADY0 to ADYj. The row address predecoded signals ADX0 to ADXi are complementary signals of the row address predecoded signals ACX0 to ACXi, respectively, and the column address predecoded signals ADY0 to ADYj are the complementary signals to the column address predecoded signals ACY0 to ACYj. The regular memory cell blocks 301 to 30n are respectively associated with regular row address decoder circuits 351, 352, 353, ... and 35n, and the row address decoder circuits 351 to 35n selectively drive the associated sets of word lines WL1 to WLs. The address predecoded signals ACX0 to ACXi/ ADX0 to ADXi are indicative of a row address assigned to the corresponding word lines of the regular memory cell blocks 301 to 30n, and are supplied to the regular row address decoder circuits 351 to 35n. However, any redundant row address decoder circuit is not incorporated in the random access memory device according to the present invention.

The column address buffer circuit 34 is associated with a column address decoder circuit 36, a block address decoder circuit 37 and a program circuit 38. Each of the memory cell blocks 301 to 30n is assigned a block address, and the columns of the regular memory cells of each regular memory cell block 301, 302, 303, . . . or 30n are respectively assigned column addresses as described hereinbefore. The external column address bits consist of higher order bits indicative of a block address and lower order bits indicative of a column address, and the address predecoded signals ACY0 to ACYj and ADY0 to ADYj are supplied partially to the column address decoder circuit 36, and the column address decoder circuit 36 produces column selecting signals CSS for selecting corresponding columns of the regular memory cells from the respective regular memory cell blocks 301 to 30n. The remaining part of the address decoded signals ACY0 to ACYj and ADY0 to ADYj are supplied to the block address decoder circuit 37, and the block address decoder circuit 37 produces block selecting signals BSS0 to BSSn for selecting one of the memory cell blocks 11 to 1n. However, all of the address decoded signals ACY0 to ACYj and ADY0 to ADYj are supplied to the program circuit 38, and the program circuit has been able to store a plurality sets of column and block addresses assigned to columns of defective regular memory cells replaced with the columns of the redundant memory cells. The program circuit 38 is similar in circuit arrangement to that of the first prior art random access memory device shown in FIGS. 2 and 3, and produces a disable signal KL and redundant column selecting signals SY1 to SYn when the external column address bits are indicative of block and column addresses assigned to one of the columns of the defective regular memory cells.

Figure 6:
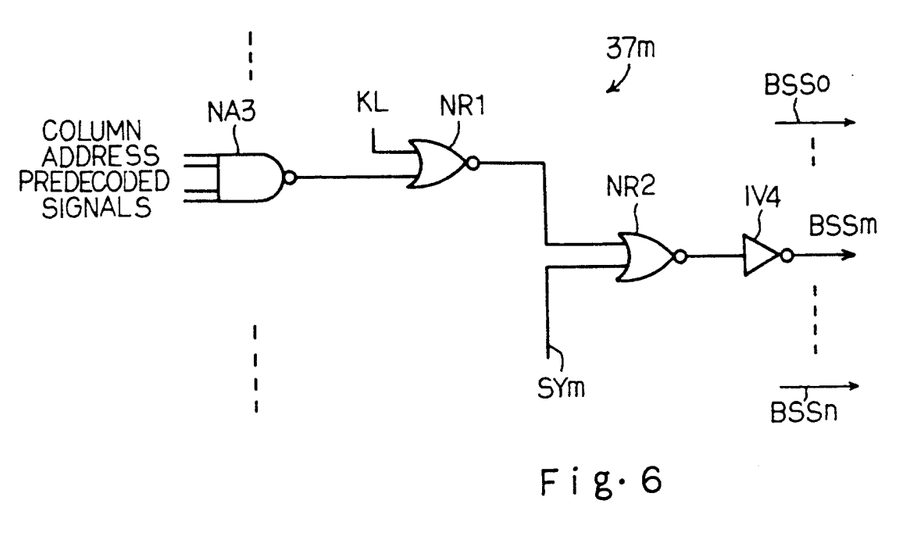
FIG. 6 is a circuit diagram showing a decoder unit incorporated in a block address decoder circuit of the random access memory device shown in FIG. 5.

FIG. 6 illustrates a decoder unit 37m incorporated in the block decoder circuit 37, and comprises a NAND gate NA3, NOR gates NR1 and NR2 and an inverter IV4. The decoder unit 37m is assumed to be associated with one of the regular memory cell blocks 30i, and, accordingly, the subscript m is selected from 1 to n. The other decoder units are respectively associated with the other regular memory cell blocks, and the other decoder units are similar in circuit arrangement to the decoder unit 37m. The higher order bits of the column address predecoded signals are selectively supplied to the NAND gate NA3, and the disable signal KL and one of the redundant column selecting signals SYm are supplied to the NOR gates NR1 and NR2. The subscript m is also selected from 1 to n. If the higher order bits of the column address predecoded signals are indicative of the regular memory cell block 30m, all of the column address predecoded signals supplied to the NAND gate NA3 are logic "1" level, and the NAND gate NA3 supplies logic "1" bit to the NOR gate NR1. If the external column address bits are not indicative of one of the columns of the defective regular memory cells, the disable signal KL remains in logic "0" level, and the NOR gate NR1 supplies a logic "1" bit to the next NOR gate NR2. In this situation, the redundant column selecting signal SYm remains in logic "0" level, and the NOR gate NR2 supplies a logic "0" bit to the inverter IV4. The redundant column selecting signal SYm is indicative of the redundant memory cell sub-block 31m where the subscript m is between 1 to n. Then, the inverter produces the block selecting signal BSSm where the subscript m is also between one and n. However, if the external column address bits are indicative of the block and column addresses assigned to one of the columns of the defective regular memory cells, the disable signal KL is shifted to logic "1" level, and the NOR gate NR1 produces a logic "0" bit regardless of the logic level at the other input node. In other words, the NAND gate NA3 is not responsive to the higher order bits of the column address predecoded signals, and the NR gate NR2 is enabled with the logic "0" bit. If the program circuit 38 acknowledges the block and column addresses indicated by the external column address bits to be consistent with one of the plurality sets of block and column addresses stored in the program circuit 38, the program circuit 38 shifts the redundant column selecting signal SYm to logic "1" level, the NOR gate NR2 supplies a logic "0" bit to the inverter IV4, and the inverter IV4 shifts the block selecting signal BSSi to active logic "1" level. On the other hand, if another redundant memory cell sub-block is selected by the program circuit 38, the redundant column selecting signal BSSm remains in logic "0" level, and the NOR gate NR2 causes the inverter IV4 to shift the block selecting signal BSSi to inactive logic "0" level. Thus, the block address decoder circuit 37 allows one of the redundant memory cell sub-blocks 311 to 31n to becomes accessible. Even if the column of the defective memory cells and the redundant memory cell sub-block are associated with different regular memory cell blocks, the block address decoder circuit 37 of the present invention replaces the column of the defective regular memory cells with the redundant memory cell sub-block.

The data transmission sub-unit comprises regular column selector circuits 391, 392, 393, . . . and 39n respectively associated with the regular memory cell blocks 301 to 30n, transfer gates 401, 402, 403, . . . and 40n respectively coupled with the redundant memory cell sub-blocks 311 to 31n, sense amplifier/ write driver circuits 411, 412, 413, . . . and 41n coupled with the regular column selector circuits 391 to 39n as well as with the transfer gates 401 to 40n, and an input/ output data buffer circuit 43 shared between the sense amplifier/ write driver circuits 411 to 41n. However, any redundant sense amplifier/ write driver circuit is provided for the redundant memory cell block 31. The row address decoder circuits 351 to 35n and the sense amplifier/ write driver circuits 411 to 41n are selectively enabled with the block selecting signals BSS0 to BSSn, and the column selector circuits 391 to 39n are responsive to the column selecting signals CSS for selecting the columns assigned the column address from the respective regular memory cell blocks 301 to 30n. The transfer gates 401 to 40n are responsive to the redundant column selecting signals SY1 to SYn, and selectively couple the redundant memory cell sub-blocks 311 to 31n with the associated sense amplifier/ write driver circuits 411 to 41n. In this instance, the sense amplifier/ write driver circuits 411 to 41n serve as a plurality of amplifier means, and one of the transfer gates 401 to 40n serves as a transfer means.

The random access memory device thus arranged behaves as follows. If any column of the regular memory cells is not replaced with the redundant memory cell sub-blocks 311 to 31n, the column address decoder circuit 36 and the block address decoder circuit 37 are enabled without the disable signal KL at all times, and the block address decoder circuit 37 enables one of the regular row address decoder circuits 351 to 35n and one of the sense amplifier/ write driver circuits 411 to 41n on the basis of the external column address bits AY0 to AYj. In the read-out phase of operation, the enabled regular row address decoder circuit is responsive to the address predecoded signals ACX0 to ACXi/ ADX0 to ADXi, and drives one of the word lines WL1 to WLs. Then, data bits are read out from the regular memory cells coupled with the selected word line of the associated memory cell block to the associated digit line pairs D1 to Dt. The associated column selector circuit is responsive to the column selecting signals CSS, and transfers one of the data bits on the digit line pairs D1 to Dt to the associated sense amplifier/ wire driver circuit. The differential voltage indicative of the selected data bit is developed by the sense amplifier and the developed differential voltage is relayed to the input/ output data buffer circuit 43. The read-out data bit is delivered from the input/ output data buffer circuit 43.

On the other hand, if the random access memory device entered in the write-in phase of operation, a write-in data bit is relayed vice versa, and written into one of the regular memory cells of the selected regular memory cell block coupled with the selected word line.

On the other hand, if columns of defective regular memory cells are respectively replaced with the columns of the redundant memory cells or the redundant memory cell sub-blocks 311 to 31n, the program circuit 38 stores sets of block and column addresses assigned to the columns of the defective regular memory cells by selectively breaking fuse elements. If the random access memory device is established in the read-out phase, the address predecoded signals ACY0 to ACYj/ ADY0 to ADYj supply the block and column addresses indicated by the external column address bits AY0 to AYj to the program circuit 38, and the program circuit 38 compares the block and column addresses with the sets of block and column addresses stored therein. If the block and column addresses are not consistent with any one of the sets of block and column addresses, the block and column address decoder circuits 37 and 36 behave as those described hereinbefore. However, if the block and column addresses are matched with one if the sets of block and column addresses, the program circuit 38 disables the column and block address decoder circuits 36 and 37 with the disable signal KL, and shifts one of the redundant column selecting signals SY1 to Syn to an active level. The block address decoder circuit 37 is not responsive to the higher order bits of the column address predecoded signals ACY0 to ACYj/ ADY0 to ADYj, and becomes responsive to the redundant column selecting signal of the active level. Then, the block address decoder circuit 37 shifts one of the block selecting signal corresponding to the redundant column selecting signal to the active level, and the block selecting signal of the active level enables the row address decoder circuit as well as the sense amplifier/ write driver circuit. One of the transfer gates 401 to 40n turns on with the redundant columL selecting signal of the active level, and a data bit is transferred from the associated redundant memory cell sub-block to the associated sense amplifier/ write driver circuit. The data bit read out from the redundant memory cell sub-block is developed by the sense amplifier/ write driver circuit, and is transferred to the input/ output data buffer circuit 13. If the random access memory device is established in the write-in phase, a write-in data bit is propagated vice versa, and stored in one of the redundant memory cells.

As will be understood from the foregoing description, block decoder circuit 37 incorporated in the random access memory device allows a data bit to be read out from any one of the redundant memory cell sub-blocks 311 to 31n even if the column of defective regular memory cells and the redundant memory cell sub-block are associated with different regular memory cell blocks, and improves the production yield.

Second Embodiment

Figure 7:
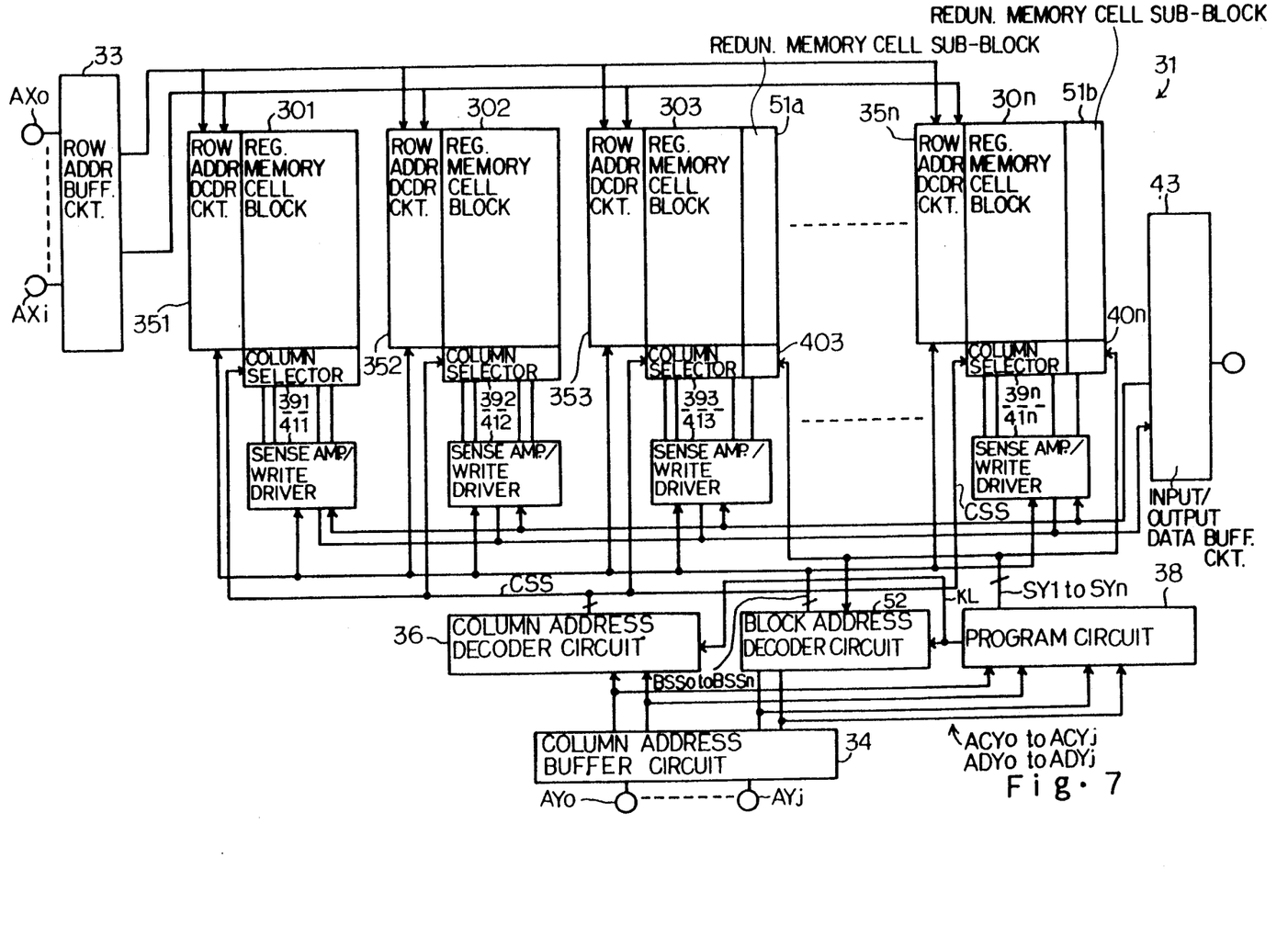
FIG. 7 is a block diagram showing the arrangement of another random access memory device according to the present invention.
Figure 8:
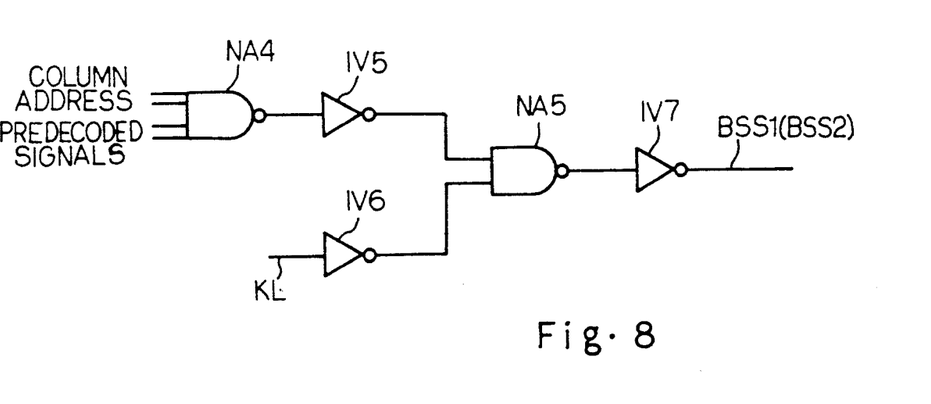
FIG. 8 is a circuit diagram showing a decoder unit incorporated in a block address decoder circuit of the random access memory device shown in FIG. 7.

Turning to FIG. 7 of the drawings, another random access memory device embodying the present invention is illustrated. The random access memory device shown in FIG. 7 is similar in circuit arrangement to the first embodiment except for a redundant memory cell sub-blocks 51a and 51b selectively associated with the regular memory cell blocks, and a block address decoder circuit 52 comprises first decoder units for the regular memory cell blocks 303 to 30n associated with the redundant memory cell sub-blocks 51a and 51b, and second decoder units for the regular memory cell blocks 301 and 302 without any redundant memory cell sub-block. The first decoder units are similar in circuit arrangement to the decoder unit 37m shown in FIG. 6, and each of the second decoder units comprises NAND gates NA4 and NA5 and inverters IV5, IV6 and IV7 as shown in FIG. 8. The NAND gate NA5 produces a logic "1" bit regardless of the column address predecoded signals supplied to the NAND gate NA4 in the presence of the disable signal KL, and the inverter IV7 shifts the block selecting signal BSS1 or BSS2 to logic "0" level. For this reason, the associated row address decoder circuit and the sense amplifier/ write driver circuit are not enabled. However, if the disable signal KL goes down to logic "0" level, the inverter IV6 enables the NAND gate NA5 with the logic "1" bit, and the inverter IV7 shifts the block selecting signal BSS1 or BSS2 between logic "1" and logic "0" depending upon the column address predecoded signals supplied to the NAND gate NA4.

The other circuit behavior is analogous, and no further description is incorporated hereinbelow for the sake of simplicity.

Although particular embodiments of the present invention have been shown and described, it will be obvious to those skilled in the art that various changes and modifications may be made without departing from the spirit and scope of the present invention. For example, a random access memory device according to the present invention may be incorporated in an ultra large scale integration together with other component devices.

What is claimed is:

1. A random access memory device comprising:
  a) a plurality of regular memory cell blocks respectively assigned block addresses, and each having columns of regular memory cells respectively assigned column addresses;
  b) at least one column of redundant memory cells associated with one of said plurality of regular memory cell blocks, said redundant memory cells respectively storing data bits, one of said columns of regular memory cells of any one of said plurality of regular memory cell blocks being replaced with said at least one column of redundant memory cells when said one of said columns contains at least one defective regular memory cell;
  c) a plurality of row address decoder circuits respectively associated with said one of said plurality of regular memory cell blocks and with the others of said plurality of regular memory cell blocks, and selectively enabled with block selecting signals indicative of one of said block addresses;
  d) a plurality of column selector circuits respectively associated with said plurality of regular memory cell blocks, and each responsive to column selecting signals indicative of one of said column addresses for selecting a column of regular memory cells from the associated regular memory cell block;
  e) at least one transfer means coupled with said at least one column of redundant memory cells, and responsive to a redundant column selecting signal for transferring one of said data bits stored in said redundant memory cells;
  f) a plurality of amplifier means respectively coupled with said plurality of column selector circuits for a read-out mode and a write-in mode of operation, one of said plurality of amplifier means being further coupled with said transfer means, said plurality of amplifier means being selectively enabled with said block selecting signals;
  g) a program circuit storing a set of block and column addresses assigned to said one of said columns of regular memory cells containing said at least one defective regular memory cell, and comparing block and column addresses indicated by external address bits to see whether or not said block and column addresses are consistent with said set of block and column addresses, said program circuit producing a disable signal and said redundant column selecting signal when said block and column addresses are consistent with said set of block and column addresses;

h) a column address decoder circuit selectively shifting said column selecting signals to an active level on the basis of parts of said external address bits indicative of said one of said column addresses in the absence of said disable signal; and i) a block address decoder circuit selectively shifting said block selecting signals to an active level on the basis of others of said external address bits indicative of said one of said block addresses in the absence of said disable signal, said block address decoder circuit being responsive to said redundant column selecting signal in the presence of said disable signal for shifting one of said block selecting signals indicative of said one of said plurality of regular memory cell blocks associated with said at least one column of redundant memory cells to said active level.

2. A random access memory device as set forth in claim 1, in which said plurality of amplifier means are implemented by a plurality of sense amplifier/ write driver circuits.

3. A random access memory device as set forth in claim 1, in which said block address decoder circuit comprises i-1) at least one first decoder unit associated with said one of said plurality of regular memory cell blocks associated with said at least one column of redundant memory cells, and having i-1-1) a first NAND gate supplied with a set of predecoded signals of said others of said external address bits, i-1-2) a first NOR gate disabled with said disable signal, and responsive to an output signal of said first NAND gate, i-1-3) a second NOR gate responsive to the output signal of said first NOR gate and to said redundant column selecting signal, and i-1-4) a first inverter coupled with said second NOR gate, and producing one of said block selecting signal.

4. A random access memory device as set forth in claim 1, in which said block address decoder circuit comprises i-1) at least one first decoder unit associated with said one of said plurality of regular memory cell blocks associated with said at least one column of redundant memory cells, and having i-1-1) a first NAND gate supplied with a set of predecoded signals of said others of said external address bits, i-1-2) a first NOR gate disabled with said disable signal, and responsive to an output signal of said first NAND gate, i-1-3) a second NOR gate responsive to the output signal of said first NOR gate and to said redundant column selecting signal, and i-1-4) a first inverter coupled with said second NOR gate, and producing one of said block selecting signal, and i-2) a plurality of second decoder units respectively associated with said others of said plurality of regular memory cell blocks, and each having i-2-1) a second NAND gate supplied with another set of predecoded signals of said others of said external address bits, i-2-2) a second inverter coupled with said second NAND gate, i-2-3) a third inverter supplied with said disable signal, i-2-4) a third NAND gate coupled with output nodes of said second and third inverters, and i-2-5) a fourth inverter coupled with said third NAND gate for producing another of said block selecting signals.

* * * * *

UNITED STATES PATENT AND TRADEMARK OFFICE
CERTIFICATE OF CORRECTION

PATENT NO. : 5,293,348

DATED : March 8, 1994

INVENTOR(S) : Kazuhiko Abe

It is certified that error appears in the above-identified patent and that said Letters Patent is hereby corrected as shown below:

Column 5, line 45, delete "in", and insert --1n--;

Column 11, line 14, delete "Syn", and insert --SYn--;

Column 11, line 26, delete "columL" and insert --column--.

Signed and Sealed this

Sixth Day of September, 1994

Attest:

BRUCE LEHMAN

Attesting Officer    Commissioner of Patents and Trademarks